(12) United States Patent
Park et al.

(10) Patent No.: US 9,842,699 B2
(45) Date of Patent: Dec. 12, 2017

(54) MULTILAYER CERAMIC CAPACITOR HAVING TERMINAL ELECTRODES AND BOARD HAVING THE SAME

(71) Applicant: SAMSUNG ELECTRO-MECHANICS CO., LTD., Suwon-Si, Gyeonggi-Do (KR)

(72) Inventors: Heung Kil Park, Suwon-Si (KR); Sang Soo Park, Suwon-Si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 37 days.

(21) Appl. No.: 14/818,207

(22) Filed: Aug. 4, 2015

(65) Prior Publication Data

US 2016/0042869 A1 Feb. 11, 2016

(30) Foreign Application Priority Data

Aug. 5, 2014 (KR) .......................... 10-2014-0100598
Nov. 17, 2014 (KR) .......................... 10-2014-0159868

(51) Int. Cl.
*H01G 4/30* (2006.01)
*H01G 4/232* (2006.01)
(Continued)

(52) U.S. Cl.
CPC .................. *H01G 4/30* (2013.01); *H01G 2/06* (2013.01); *H01G 4/232* (2013.01); *H05K 3/3442* (2013.01); *H01G 4/012* (2013.01); *H01G 4/12* (2013.01); *H05K 1/181* (2013.01); *H05K 2201/10015* (2013.01); *H05K 2201/10636* (2013.01); *H05K 2201/10909* (2013.01); *H05K 2201/10946* (2013.01); *H05K 2201/2045* (2013.01); *Y02P 70/611* (2015.11); *Y02P 70/613* (2015.11)

(58) Field of Classification Search
CPC ............ H01G 4/30; H01G 4/232; H01G 2/06; H01G 4/12; H01G 4/012; H05K 2201/10946
USPC ................................ 361/306.3, 321.1–321.5
See application file for complete search history.

(56) References Cited

U.S. PATENT DOCUMENTS 6,903,920 B1* 6/2005 Prymak .................. H01G 2/065
 361/306.1
6,972,943 B2* 12/2005 Kato ...................... H01G 9/012
 257/E23.043

(Continued)

FOREIGN PATENT DOCUMENTS

JP 04259205 A * 9/1992
JP 08017679 A * 1/1996

(Continued)

*Primary Examiner* — David M Sinclair
(74) *Attorney, Agent, or Firm* — McDermott Will & Emery LLP

(57) ABSTRACT

A multilayer ceramic capacitor may include: ceramic body including a plurality of dielectric layers and a plurality of internal electrodes, external electrodes including a connecting portion and band portion, terminal electrodes including upper and lower horizontal portion and vertical portion connecting end portion of the upper and lower horizontal portion and the conductive adhesive layers disposed to the upper surface of the band portion and upper horizontal portion.

22 Claims, 12 Drawing Sheets

(51) Int. Cl.
   *H01G 4/12*   (2006.01)
   *H05K 3/34*   (2006.01)
   *H01G 2/06*   (2006.01)
   H01G 4/012   (2006.01)
   H05K 1/18   (2006.01)

(56) References Cited

U.S. PATENT DOCUMENTS

| | | | | |
|---|---|---|---|---|
| 7,331,799 | B1* | 2/2008 | Lee | H01G 2/06 361/306.3 |
| 8,570,708 | B2* | 10/2013 | Itagaki | H01G 4/30 361/301.4 |
| 2008/0239621 | A1* | 10/2008 | Tajuddin | H01G 2/06 361/306.1 |
| 2010/0123995 | A1 | 5/2010 | Otsuka et al. | |
| 2014/0345927 | A1* | 11/2014 | Itagaki | H01G 2/065 174/260 |

FOREIGN PATENT DOCUMENTS

| | | | | |
|---|---|---|---|---|
| JP | 11251176 | A | * | 9/1999 |
| JP | 2000223357 | A | * | 8/2000 |
| JP | 2004-266110 | A | | 9/2004 |
| JP | 3847265 | A | | 11/2006 |
| JP | 2010-123614 | A | | 6/2010 |
| JP | 2012099538 | A | * | 5/2012 |

\* cited by examiner

A-A'

B-B'

MULTILAYER CERAMIC CAPACITOR HAVING TERMINAL ELECTRODES AND BOARD HAVING THE SAME

CROSS-REFERENCE TO RELATED APPLICATION

This application claims the priority and benefit of Korean Patent Application No. 10-2014-0100598 filed on Aug. 5, 2014 and Korean Patent Application No. 10-2014-0159868 filed on Nov. 17, 2014, with the Korean Intellectual Property Office, the disclosures of which are incorporated herein by reference.

BACKGROUND

The present disclosure relates to a multilayer ceramic capacitor and a board having the same thereon.

A multilayer ceramic capacitor (MLCC), a multilayer chip electronic component, has been widely used in electronic products due to advantages such as a small size, high capacitance, ease of mounting, and the like.

For example, multilayer ceramic capacitors may be mounted on boards of electronic products including display devices such as liquid crystal displays (LCDs), plasma display panels (PDPs), and the like, computers, personal digital assistants (PDAs), mobile phones, and the like, and used in chip-type condensers serving to charge or discharge electricity therein or therefrom.

Such multilayer ceramic capacitors may have a structure in which a plurality of dielectric layers and internal electrodes of different polarities disposed between the dielectric layers are alternately disposed.

Here, since the dielectric layers have a piezoelectric property, when a direct current (DC) or alternating current (AC) voltage is applied to the multilayer ceramic capacitor, a piezoelectric phenomenon may occur between the internal electrodes to generate periodical vibrations while expanding and contracting a volume of a ceramic body according to the frequency.

These vibrations may be transferred to a board through external electrodes of the multilayer ceramic capacitor and solders connecting the external electrodes to the board, such that the entire board serves as a sound reflecting surface to generate vibrating sound.

Such vibrating sound may correspond to an audio frequency of 20 to 20,000 Hz, causing discomfort to listeners. The sound that causes discomfort to listeners may be referred to as acoustic noise.

Further, since mechanical components of electronic devices have become quieter over time, the acoustic noise generated in the multilayer ceramic capacitor as described above may become more noticeable.

Thus, in a case in which an electronic device is operated in a silent environment, a user thereof may consider the acoustic noise as a device fault.

In addition, in a device having a sound circuit, the acoustic noise may be overlapped with audio output, and thus, the quality of the device may be reduced.

SUMMARY

An aspect of the present disclosure may provide a multilayer ceramic capacitor able to reduce acoustic noise, and a board having the same thereon.

According to some embodiments in the present disclosure, a multilayer ceramic capacitor may include: ceramic body including a plurality of dielectric layers and a plurality of internal electrodes, external electrodes including a connecting portion and band portion, terminal electrodes including upper and lower horizontal portion and vertical portion connecting end portion of the upper and lower horizontal portion and the conductive adhesive layers disposed to the upper surface of the band portion and upper horizontal portion.

BRIEF DESCRIPTION OF DRAWINGS

The above and other aspects, features, and other advantages of the present disclosure will be more clearly understood from the following detailed description taken in conjunction with the accompanying drawings, in which.

DETAILED DESCRIPTION

Figure 1:
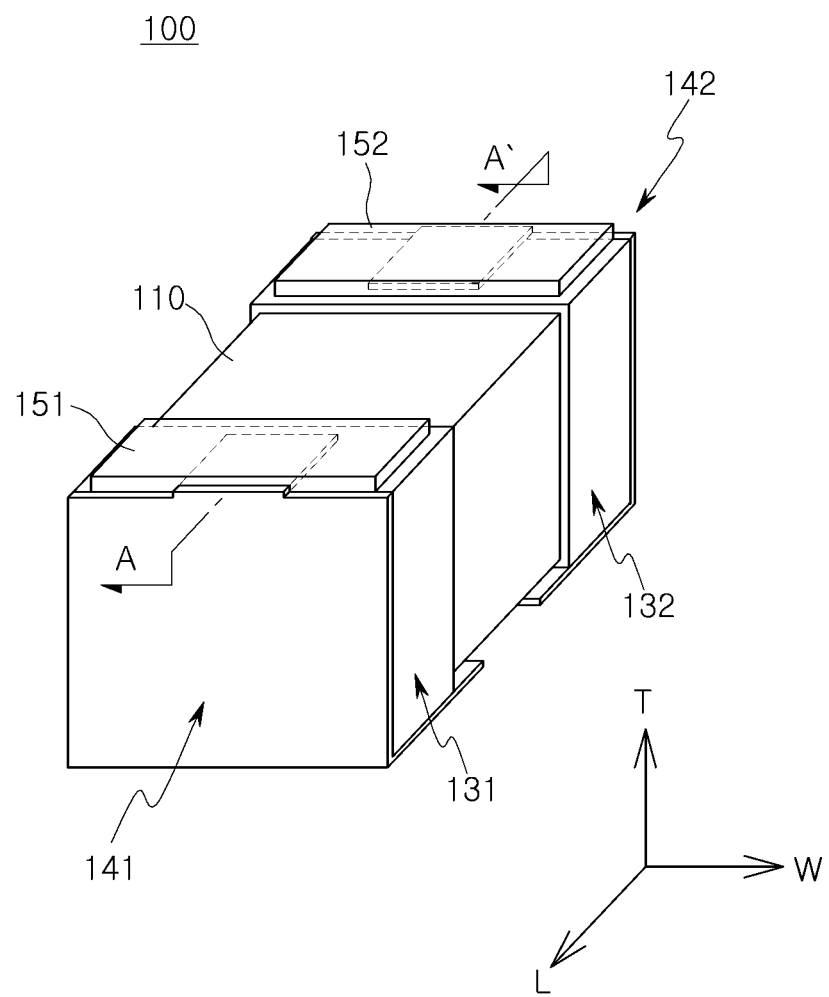
FIG. 1 is a perspective view schematically illustrating a multilayer ceramic capacitor according to an exemplary embodiment in the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
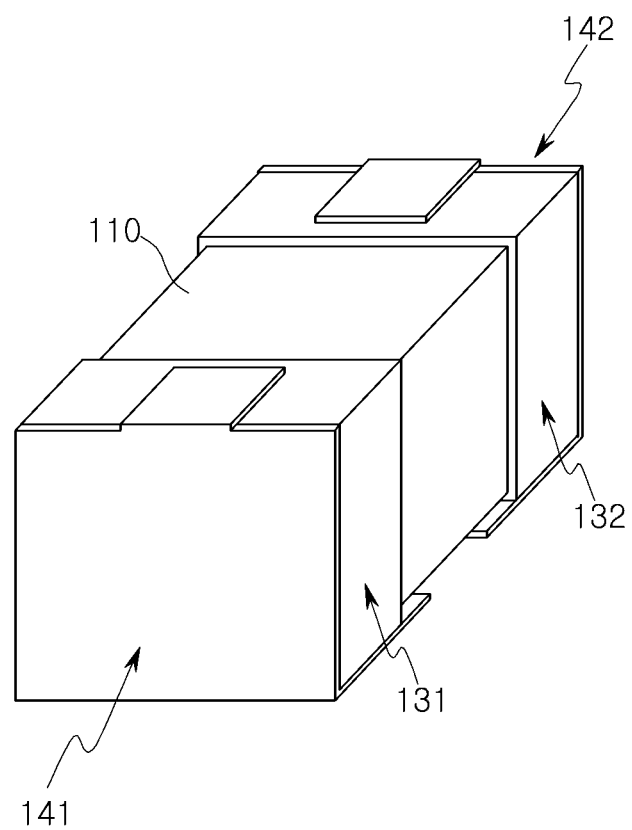
FIG. 2 is a perspective view illustrating the multilayer ceramic capacitor of FIG. 1 from which a conductive adhesive layer has been omitted.
Figure 3:
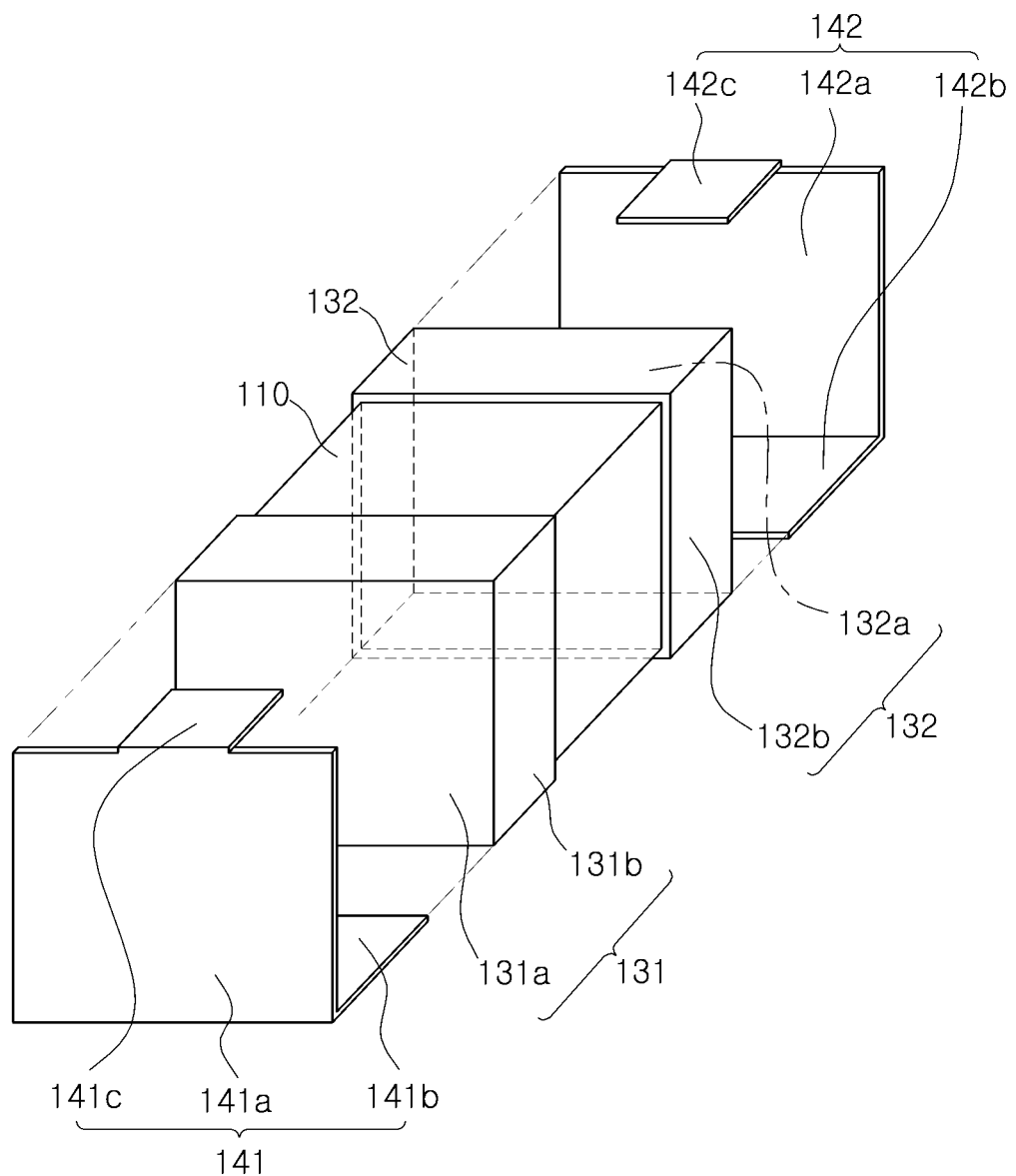
FIG. 3 is an exploded perspective view illustrating the multilayer ceramic capacitor of FIG. 1 from which a conductive adhesive layer has been omitted.
Figure 4:
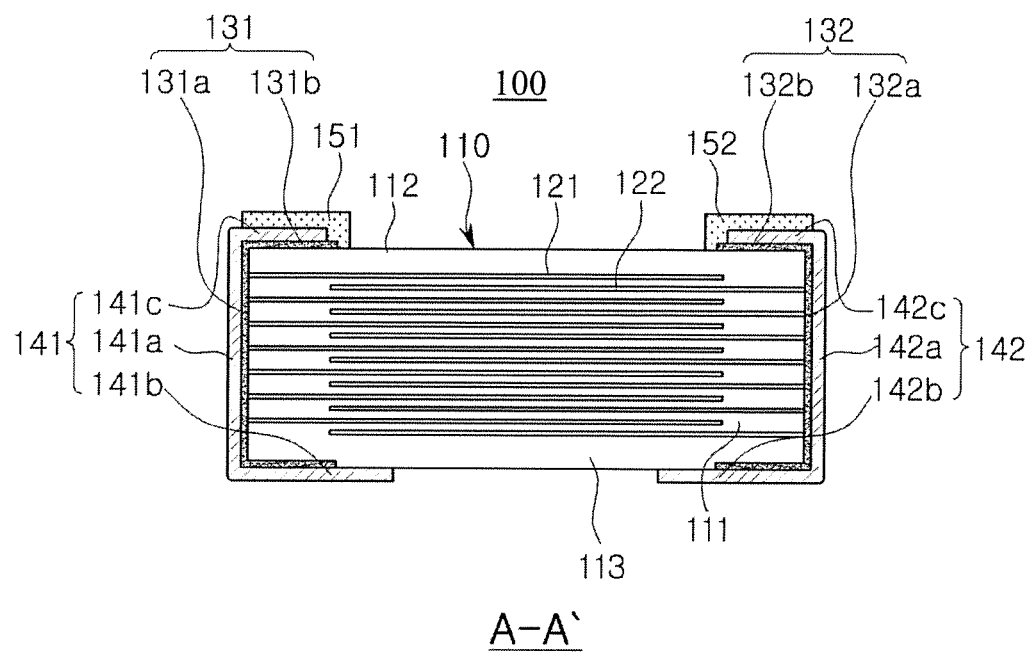
FIG. 4 is a cross-sectional view taken along line A-A' of FIG. 1.
Figure 5:
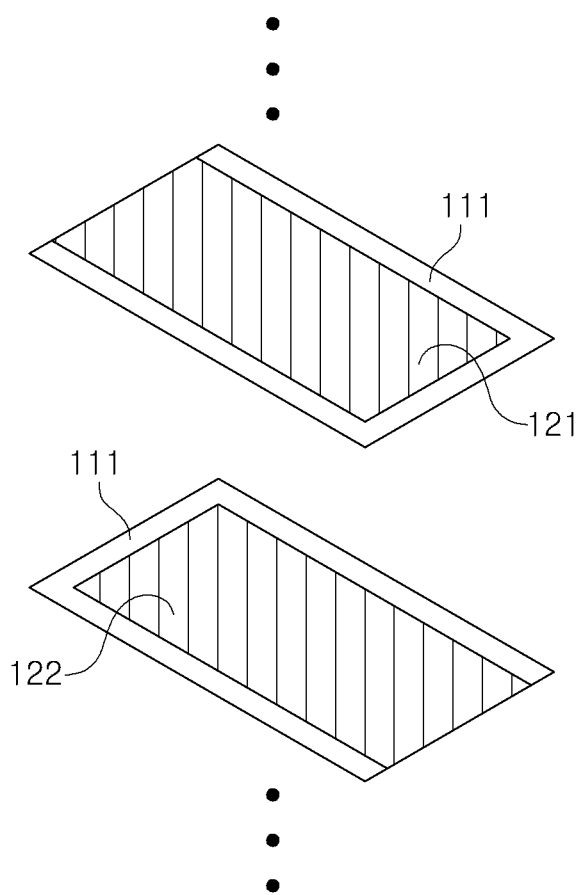
FIG. 5 is a perspective view schematically illustrating an arrangement of internal electrodes of the multilayer ceramic capacitor according to an exemplary embodiment in the present disclosure.

FIG. 1 is a perspective view schematically illustrating a multilayer ceramic capacitor according to an exemplary embodiment in the present disclosure. FIG. 2 is a perspective view illustrating the multilayer ceramic capacitor of FIG. 1 from which a conductive adhesive layer has been omitted. FIG. 3 is an exploded perspective view illustrating the multilayer ceramic capacitor of FIG. 1 from which a conductive adhesive layer has been omitted. FIG. 4 is a cross-sectional view taken along line A-A' of FIG. 1. FIG. 5 is a perspective view schematically illustrating an arrangement of internal electrodes of the multilayer ceramic capacitor according to an exemplary embodiment in the present disclosure.

Referring to FIG. 4, a multilayer ceramic capacitor 100 according to an exemplary embodiment in the present disclosure may include a ceramic body 110, a plurality of first and second internal electrodes 121 and 122, first and second external electrodes 131 and 132, first and second terminal electrodes 141 and 142, and first and second conductive adhesive layers 151 and 152.

The ceramic body 110 may be formed by stacking a plurality of dielectric layers 111 in a thickness direction of the ceramic body 110 and then sintering the plurality of dielectric layers 111.

Here, the respective adjacent dielectric layers 111 of the ceramic body 110 may be integrated with each other so that boundaries therebetween are not readily apparent.

In addition, the ceramic body 110 may have a hexahedral shape. However, the ceramic body 110 is not limited to that shape.

In the exemplary embodiment of in present disclosure, for convenience in description, upper and lower surfaces may refer to surfaces opposing each other in a thickness direction in which the dielectric layers 111 of the ceramic body 110 are stacked, and a mounted surface may refer to the lower surface.

In addition, the ceramic body 110, while not be particularly limited, may have a size of, for example, 1.6 mm×0.8 mm, or the like, to permit the multilayer ceramic capacitor 100 to have a high capacitance.

Further, cover layers 112 and 113 of predetermined thicknesses may be disposed on an upper surface of an uppermost internal electrode of the ceramic body 110 and below the lowermost internal electrode of the ceramic body 110, respectively, if necessary or desired.

Here, the cover layers 112 and 113 may be formed to have the same composition as that of the dielectric layer 111 and be formed by stacking at least one or more dielectric layers not including internal electrodes on upper and lower surfaces of the ceramic body 110.

A thickness of one dielectric layer 111 may be selected depending on a capacitance design of the multilayer ceramic capacitor 100. Preferably, a thickness of one dielectric layer 111 may be about 1.0 μm after the dielectric layer 111 is sintered. However, the thickness of one dielectric layer 111 is not limited thereto.

In addition, the dielectric layer 111 may contain a ceramic material of high permittivity such as a ceramic powder based on barium titanate ($BaTiO_3$), or the like. However, a material of the dielectric layer 111 is not limited thereto.

An example of the ceramic powder based on barium titanate ($BaTiO_3$) may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, the ceramic powder is not limited thereto.

The dielectric layer 111 may further contain a ceramic additive, an organic solvent, a plasticizer, a binder, a dispersant, and/or the like, in addition to the ceramic powder.

The ceramic additive may be, for example, a transition metal oxide or carbide, a rare earth element, magnesium (Mg), aluminum (Al), or the like.

The first and second internal electrodes 121 and 122 may be formed on ceramic sheets forming the dielectric layers 111, stacked, and then sintered, such that the first and second internal electrodes 121 and 122 are alternately disposed in the ceramic body 110 with the respective dielectric layers 111 interposed between.

The first and second internal electrodes 121 and 122, which are electrodes having different polarities, may be disposed to face each other in a direction in which the dielectric layers 111 are stacked, and be electrically insulated from each other by the dielectric layers 111 disposed therebetween.

End portions of the first and second internal electrodes 121 and 122 may be exposed to first and second side surfaces of the ceramic body 110 in a length direction of the ceramic body 110, respectively.

The end portions of the first and second internal electrodes 121 and 122 alternately exposed to both end surfaces of the ceramic body 110 as described above may be electrically connected to the first and second external electrodes 131 and 132, respectively, on both end surfaces of the ceramic body 110 in a length direction thereof.

Here, the first and second internal electrodes 121 and 122 may be formed of a conductive material, for example, a material such as nickel, a nickel alloy, or the like. Materials of the first and second internal electrodes 121 and 122 are not limited thereto.

According to the configuration as described above, when predetermined voltages are applied to the first and second external electrodes 131 and 132, electric charges may be accumulated between the first and second internal electrodes 121 and 122 facing each other.

Here, a capacitance of the multilayer ceramic capacitor 100 may be in proportion to an area at which the first and second internal electrodes 121 and 122 are overlapped with each other in the direction in which the dielectric layers 111 are stacked.

Although a multilayer ceramic capacitor in which the first and second internal electrodes 121 and 122 are horizontally stacked in the thickness direction of the ceramic body 110 has been illustrated and described in the exemplary embodiment in the present disclosure, the multilayer ceramic capacitor according to the present disclosure is not limited thereto, and may also be a multilayer ceramic capacitor in which first and second internal electrodes are vertically stacked, if necessary or desired.

The first and second external electrodes 131 and 132 may be formed by sintering conductive paste for an external electrode containing copper (Cu) so that the first and second external electrodes 131 and 132 have excellent electrical properties and high reliability such as excellent heat cycle resistance, moisture resistance, and the like. However, the first and second external electrodes 131 and 132 are not limited to being formed as described above.

The first external electrode 131 may include first connecting portion 131a and first band portion 131b, and the second external electrode 132 may include second connecting portion 132a and second band portion 132b.

The first and second connecting portions 131a and 132a may cover both end surfaces of the ceramic body 110, respectively, and be electrically connected to exposed end portions of the first and second internal electrodes 121 and 122, respectively.

The first and second band portions 131b and 132b may be extended from the first and second connecting portions 131a and 132a, respectively, to cover portions of upper, lower, and side surfaces of the ceramic body 110.

Meanwhile, plating layers (not illustrated) may be formed on the first and second external electrodes 131 and 132.

As an example, the plating layers may include first and second nickel (Ni) plating layers each formed on the first and second external electrodes 131 and 132 and first and second tin (Sn) plating layers each formed on the first and second nickel plating layers.

The first and second terminal electrodes 141 and 142 may have a 'C' shape and include first and second upper horizontal portions 141c and 142c each bonded to upper surfaces of the first and second band portions 131b and 132b, first and second lower horizontal portions 141b and 142b each disposed beneath the first and second band portions 131b and 132b, and first and second vertical portions 141a and 142a each connecting end portions of the first and second upper horizontal portions 141c and 142c and the first and second lower horizontal portions 141b and 142b to each other, respectively.

Here, lengths of the first and second upper horizontal portions 141c and 142c may be shorter than those of the upper surfaces of the first and second band portions 131b and 132b.

In addition, the first and second upper horizontal portions 141c and 142c may further have cut-out portions in both sides thereof, as shown in FIG. 3.

Thus, contact areas between the first and second upper horizontal portions 141c and 142c and the upper surfaces of the first and second band portions 131b and 132b of the first and second external electrodes 131 and 132 may be reduced, such that the amount of vibrations transferred from the first and second external electrodes 131 and 132 may be reduced.

In addition, the first and second lower horizontal portions 141b and 142b may be subjected to surface treatment such as nickel/tin plating, nickel/gold plating, or the like, if necessary or desired, to improve solder adhesion when the multilayer ceramic capacitor is mounted on a board.

The first and second lower horizontal portions 141b and 142b may be disposed to closely adhere to lower surfaces of the first and second band portions 131b and 132b, respectively.

The first and second vertical portions 141a and 142a may be disposed to closely adhere to the first and second connecting portions 131a and 132a, respectively.

In this case, since only the first and second upper horizontal portions 141c and 142c of the first and second terminal electrodes 141 and 142 and the upper surfaces of the first and second band portions 131b and 132b of the first and second external electrodes 131 and 132 are bonded to each other, acoustic noise may be further reduced.

In addition, the first and second electrode terminals 141 and 142 may absorb mechanical stress generated due to deformation of the board occurring due to elastic force, and reduce the mechanical stress arriving at the ceramic body 110 to prevent defects or damage such as cracks, or the like, generated in the ceramic body 110, thereby ensuring reliability improvement.

In addition, according to this embodiment, since sufficient elastic force may be obtained by the first and second terminal electrodes 141 and 142, the first and second lower horizontal portions 141b and 142b of the first and second terminal electrodes 141 and 142 may be in contact with the respective lower surfaces of the first and second band portions 131b and 132b, such that product height may be reduced.

Meanwhile, plating layers (not illustrated) may be formed on the first and second terminal electrodes 141 and 142.

As an example, the plating layers may include first and second nickel (Ni) plating layers each formed on the first and second terminal electrodes 141 and 142 and first and second tin (Sn) plating layers each formed on the first and second nickel plating layers.

As another example, the plating layers may include first and second nickel (Ni) plating layers each formed on the first and second terminal electrodes 141 and 142 and first and second gold (Au) plating layers each formed on the first and second nickel plating layers.

The first and second conductive adhesive layers 151 and 152 may be disposed to connect the upper surfaces of the first and second band portions 131b and 132b and to the respective first and second upper horizontal portions 141c and 142c.

The first and second conductive adhesive layers 151 and 152 may be formed by applying and then hardening, for example, high temperature solders or conductive pastes.

According to this embodiment, the first and second conductive adhesive layers 151 and 152 may be disposed to simultaneously cover the upper surfaces of the first and second band portions 131b and 132b and the first and second upper horizontal portions 141c and 142c, to connect the upper surfaces of the first and second band portions 131b and 132b to the respective first and second upper horizontal portions 141c and 142c, thereby electrically connecting the first and second external electrodes 131 and 132 to the respective first and second terminal electrodes 141 and 142.

In addition, the first and second conductive adhesive layers 151 and 152 may be formed to have areas that are the same as or are substantially similar to those of the upper surfaces of the first and second band portions 131b and 132b, in order to increase electrical connectivity and prevent reduced reliability.

Figure 6:
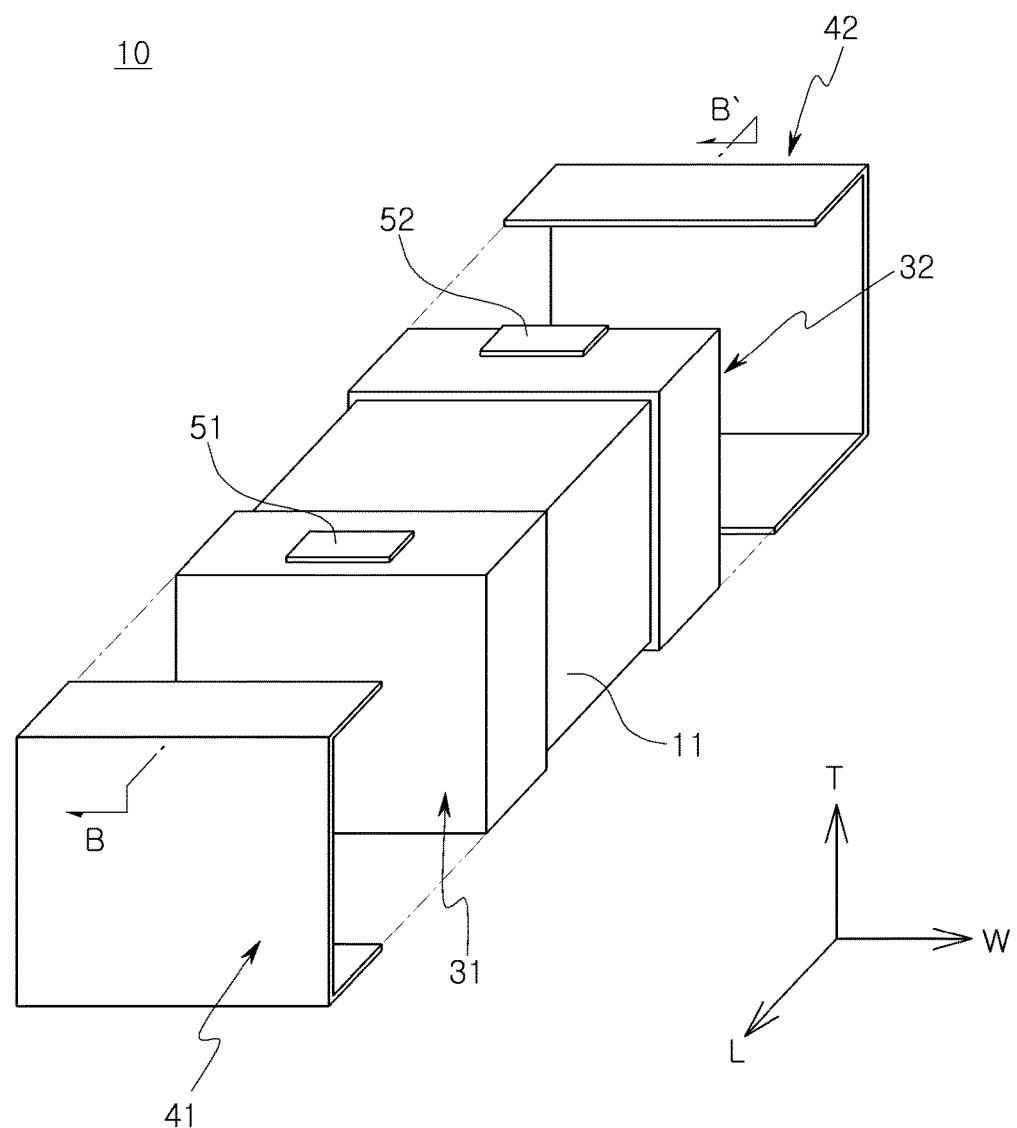
FIG. 6 is a perspective view schematically illustrating a multilayer ceramic capacitor according to another exemplary embodiment in the present disclosure.
Figure 7:
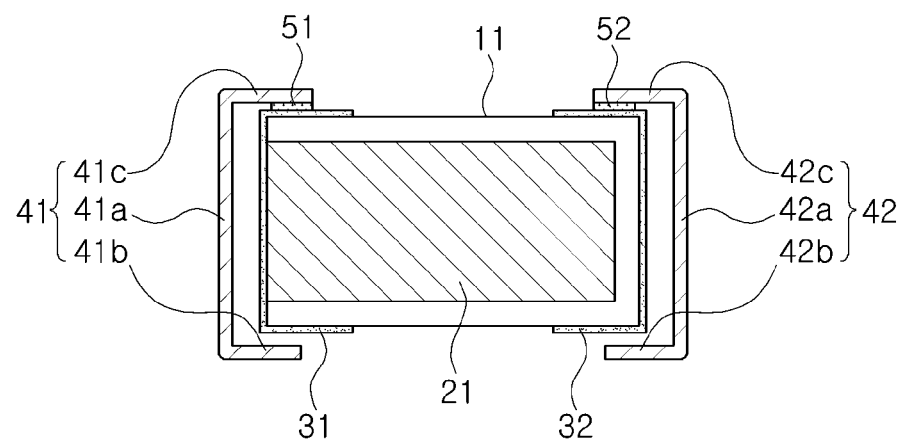
FIG. 7 is a cross-sectional view taken along line B-B' of FIG. 6.

FIG. 6 is a perspective view schematically illustrating a multilayer ceramic capacitor according to another exemplary embodiment in the present disclosure, and FIG. 7 is a cross-sectional view taken along line B-B' of FIG. 6.

Here, structures of ceramic body 11 of a multilayer ceramic capacitor 10 and first and second external electrodes 31 and 32 are similar to those of ceramic body 110 and first and second external electrodes 131 and 132 in the above-mentioned embodiment. Thus, a detailed description thereof will be omitted, and only first and second terminal electrodes 41 and 42 and first and second conductive adhesive layers 51 and 52 will be described.

The first and second terminal electrodes 41 and 42 may have a 'C' shape, and include: first and second upper horizontal portions 41c and 42c each bonded to upper surfaces of band portions of the respective first and second external electrodes 31 and 32; first and second lower horizontal portions 41b and 42b each disposed beneath the respective band portions of the first and second external electrodes 31 and 32; and first and second vertical portions 41a and 42a each connecting end portions of the first and second upper horizontal portions 41c and 42c and the first and second lower horizontal portions 41b and 42b to each other, respectively.

Here, lengths of the first and second upper horizontal portions 41c and 42c may correspond to those of the upper surfaces of the band portions of the first and second external electrodes 31 and 32.

In addition, the first and second lower horizontal portions 41b and 42b may be disposed to be spaced apart from lower surfaces of the band portions of the first and second external electrodes 31 and 32, respectively.

Further, the first and second vertical portions 41a and 42a may be disposed to be spaced apart from connecting portions of the first and second external electrodes 31 and 32, respectively.

In this structure, since only the first and second upper horizontal portions 41c and 42c of the first and second terminal electrodes 41 and 42 and the upper surfaces of the band portions of the first and second external electrodes 31 and 32 contact each other, acoustic noise may be further reduced.

In addition, the first and second electrode terminals 41 and 42 may absorb mechanical stress generated due to deformation of the board occurring due to elastic force and reduce the mechanical stress arriving at the ceramic body 110 to prevent defects or damage such as cracks, or the like, generated in the ceramic body 110, thereby ensuring improved reliability.

In addition, according to this embodiment, since sufficient elastic force may be obtained by the first and second terminal electrodes 41 and 42, even in a case in which the first and second lower horizontal portions 41b and 42b of the first and second terminal electrodes 41 and 42 and the lower surfaces of the band portions of the first and second external electrodes 31 and 32 are spaced apart from each other, the first and second lower horizontal portions 41b and 42b of the first and second terminal electrodes 41 and 42 and the lower surfaces of the band portions of the first and second external electrodes 31 and 32 may maintain only a minimal distance therebetween, such that product height may be further reduced.

In this embodiment, the first and second conductive adhesive layers 51 and 52 may be disposed between the first and second upper horizontal portions 41c and 42c and the upper surfaces of the band portions of the first and second external electrodes 31 and 32, respectively.

In addition, the first and second conductive adhesive layers 51 and 52 may be formed to have areas smaller than those of the upper surfaces of the band portions of the first and second external electrodes 31 and 32.

In this case, the first and second conductive adhesive layers 51 and 52 may locally bond the first and second external electrodes 31 and 32 and the first and second terminal electrodes 41 and 42 to each other, respectively, thereby reducing the amount of vibrations transferred from the first and second external electrodes 31 and 32 to the first and second terminal electrodes 41 and 42.

Figure 8:
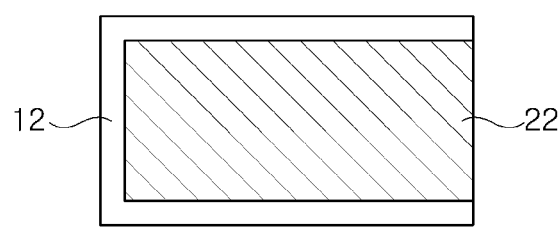
FIG. 8 is a front view schematically illustrating an arrangement of internal electrodes of the multilayer ceramic capacitor according to another exemplary embodiment in the present disclosure.
Figure 8:
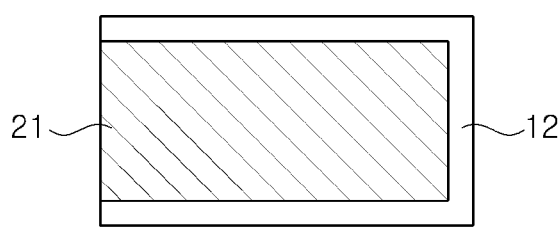

As illustrated in FIG. 8, the multilayer ceramic capacitor has first and second internal electrodes 21 and 22 disposed on dielectric layers 12, which in the present embodiment are vertically stacked in the width direction of the ceramic body 11. However, the multilayer ceramic capacitor according to the present disclosure is not limited thereto, and may also be a multilayer ceramic capacitor in which first and second internal electrodes disposed on dielectric layers are horizontally stacked, if necessary or desired.

Figure 9:
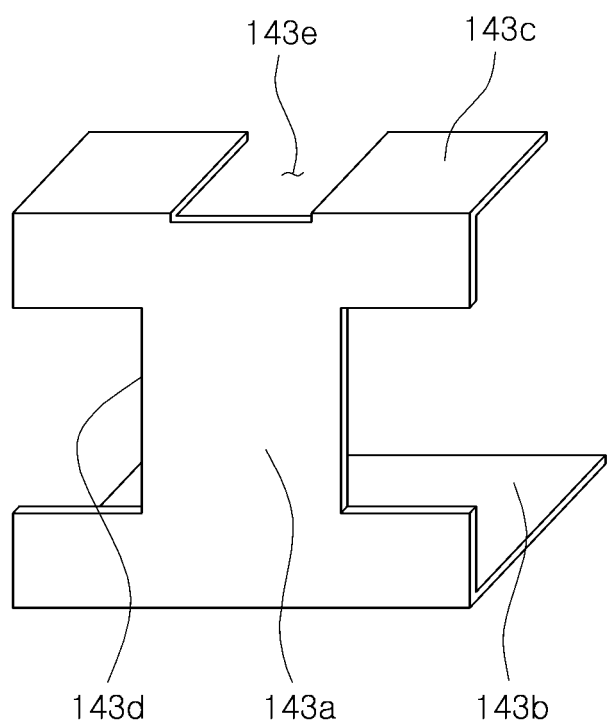
FIG. 9 is a perspective view illustrating another example of a terminal electrode in the multilayer ceramic capacitor according to an exemplary embodiment in the present disclosure.

FIG. 9 is a perspective view illustrating another example of a terminal electrode in a multilayer ceramic capacitor according to an exemplary embodiment in the present disclosure.

Here, since a second terminal electrode is disposed on a surface of the ceramic body 110 opposing a surface of the ceramic body 110 on which a first terminal electrode is disposed and has a structure similar to that of the first terminal electrode, a detailed description of the second terminal electrode will be omitted, and only the first terminal electrode will be described.

Referring to FIG. 9, the first terminal electrode 143 according to an exemplary embodiment in the present disclosure may have a cut-out portion 143e formed at the center of an upper horizontal portion 143c in the width direction of the ceramic body 110.

The cut-out portion 143e may reduce a contact area between the first terminal electrode 143 and a first band portion 131b of a first external electrode 131, thereby further reducing vibration transferred from the first external electrode 131.

In addition, the first terminal electrode 143 may have cut-out portions 143d formed in both sides of a vertical portion 143a in the width direction of the ceramic body 110. The cut-out portion 143d may also be formed at only one side of the vertical portion 143a in the width direction of the ceramic body 110, if necessary or desired.

The cut-out portion 143d may reduce an area of a portion that becomes a vibration medium to reduce vibration transferred from the first external electrode 131.

A reference numeral 143b indicates a lower horizontal portion of the first terminal electrode 143 according to the exemplary embodiment in the present disclosure.

Figure 10:
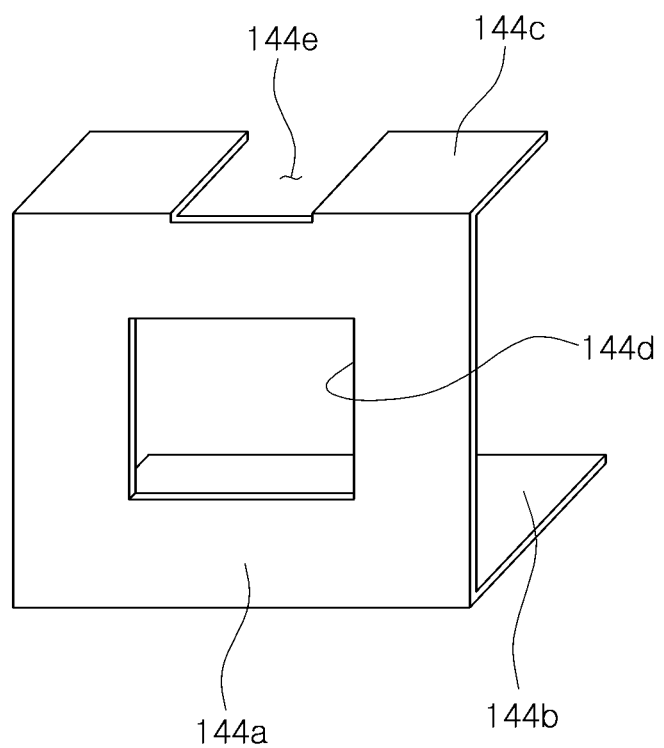
FIG. 10 is a perspective view illustrating another example of a terminal electrode in the multilayer ceramic capacitor according to an exemplary embodiment in the present disclosure.

FIG. 10 is a perspective view illustrating another example of a terminal electrode in a multilayer ceramic capacitor according to an exemplary embodiment in the present disclosure.

As in the prior embodiment, since a second terminal electrode is disposed on a surface of the ceramic body 110 opposing a surface of the ceramic body 110 on which a first terminal electrode is disposed and has a structure similar to that of the first terminal electrode, a detailed description thereof will be omitted, and only the first terminal electrode will be described.

Referring to FIG. 10, a first terminal electrode 144 according to the exemplary embodiment in the present disclosure may have a cut-out portion 144e formed at the center of an upper horizontal portion 144c in the width direction of the ceramic body 110.

The cut-out portion 144e may reduce a contact area between the first terminal electrode 144 and a first band portion 131b of a first external electrode 131, thereby reducing vibration transferred from the first external electrode 131.

In addition, the first terminal electrode 144 may have a cut-out portion 144d formed at the center of a vertical portion 144a.

The cut-out portion 144d may reduce an area of a portion that becomes a vibration medium to reduce vibration transferred from the first external electrode 131.

A reference numeral 144b indicates a lower horizontal portion of the first terminal electrode 144 according to the exemplary embodiment in the present disclosure.

Figure 11:
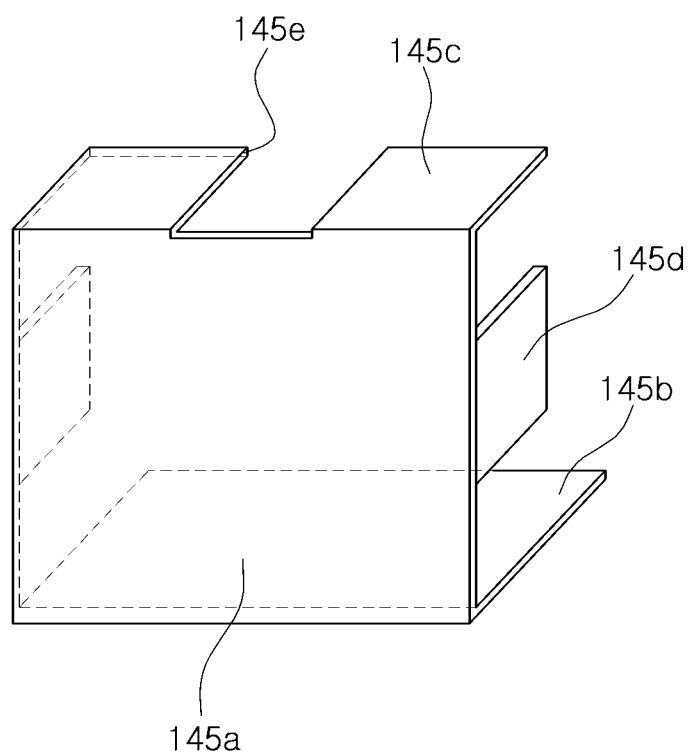
FIG. 11 is a perspective view illustrating another example of a terminal electrode in the multilayer ceramic capacitor according to an exemplary embodiment in the present disclosure.

FIG. 11 is a perspective view illustrating another example of a terminal electrode in a multilayer ceramic capacitor according to an exemplary embodiment in the present disclosure.

As in the prior embodiments, since a second terminal electrode is disposed on a surface of the ceramic body 110 opposing a surface of the ceramic body 110 on which a first terminal electrode is disposed and has a structure similar to that of the first terminal electrode, a detailed description thereof will be omitted, and only the first terminal electrode will be described.

Referring to FIG. 11, a first terminal electrode 145 according to the exemplary embodiment in the present disclosure may have a cut-out portion 145e formed at the center of an upper horizontal portion 145c in the width direction of the ceramic body 110.

The cut-out portion 145e may reduce a contact area between the first terminal electrode 145 and a first band portion 131b of a first external electrode 131, thereby reducing vibration transferred from the first external electrode 131.

In addition, the first terminal electrode 145 may have a pair of guide portions 145d extended from both end portions of a first vertical portion 145a to portions of both side surfaces of the ceramic body 110 in the width direction thereof.

The guide portions 145d may improve position precision when the first terminal electrode 145 is disposed on the first external electrode 131.

A reference numeral 145b indicates a lower horizontal portion of the first terminal electrode 145 according to the exemplary embodiment in the present disclosure.

Figure 12:
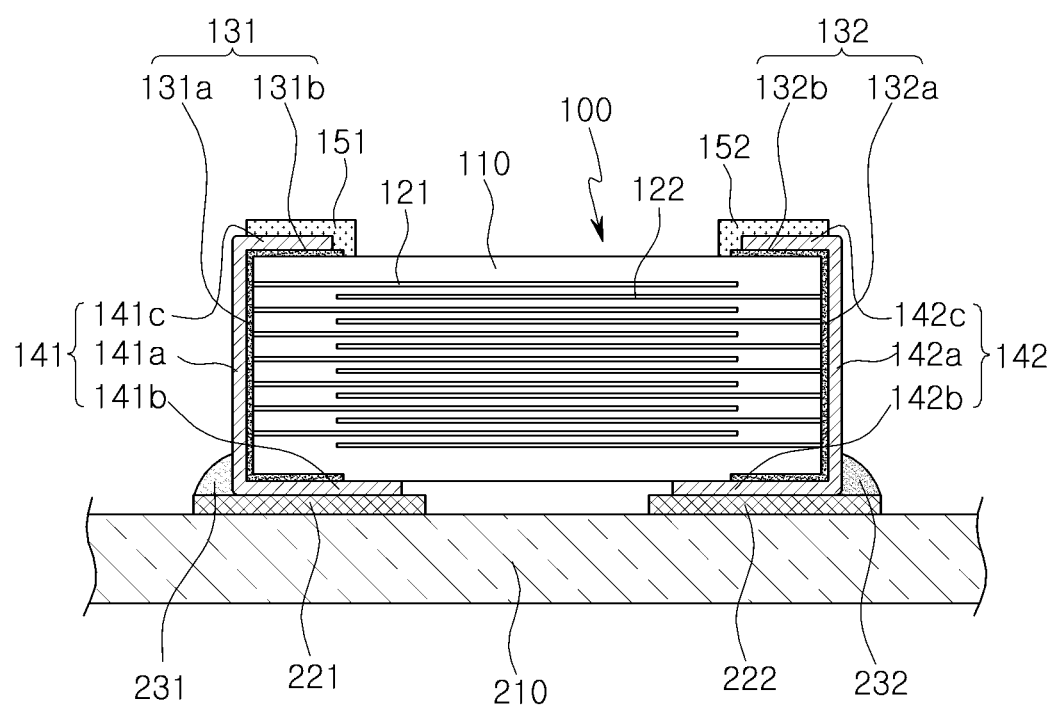
FIG. 12 is a lateral cross-sectional view schematically illustrating a board having a multilayer ceramic capacitor according to an exemplary embodiment in the present disclosure thereon.

FIG. 12 is a lateral cross-sectional view schematically illustrating a board having a multilayer ceramic capacitor according to an exemplary embodiment in the present disclosure thereon.

Referring to FIG. 12, a board 210 having a multilayer ceramic capacitor 100 according to the exemplary embodiment in the present disclosure thereon may include aboard 210 on which the multilayer ceramic capacitor 100 is mounted and first and second electrode pads 221 and 222 formed on an upper surface of the board 210 to be spaced apart from each other.

The first and second lower horizontal portions 141b and 142b of the first and second terminal electrodes 141 and 142 disposed on the lower surface of the ceramic body 110, which is the mounted surface of the ceramic body 110, are positioned to contact the first and second electrode pads 221 and 222 of the board 210 thereon, respectively, such that the multilayer ceramic capacitor 100 may be bonded and electrically connected to the board 210 by solders 231 and 232.

As described above, when voltages having different polarities are applied to the first and second external electrodes 131 and 132 formed on both end portions of the multilayer ceramic capacitor 100 in a state in which the multilayer ceramic capacitor 100 is mounted on the board 210, the ceramic body 110 may be expanded and contracted in the thickness direction thereof due to an inverse piezoelectric effect of a dielectric layers 111, and both end portions of the first and second external electrodes 131 and 132 may be contracted and expanded as opposed to the expansion and the contraction of the ceramic body 110 in the thickness direction thereof due to a Poisson effect.

This contraction and expansion may generate vibrations. In addition, the vibrations may be transferred from the first and second external electrodes 131 and 132 to the board 210. Thus, sound may be radiated from the board 210, which may become acoustic noise.

In this embodiment, piezoelectric vibrations transferred to the board through the first and second external electrodes 131 and 132 of the multilayer ceramic capacitor 100 may be absorbed using elasticity of the first and second terminal electrodes 141 and 142, and mechanical stress generated due to warpage of the board or the like may be absorbed by the first and second terminal electrodes 141 and 142, thereby reducing acoustic noise.

Figure 13:
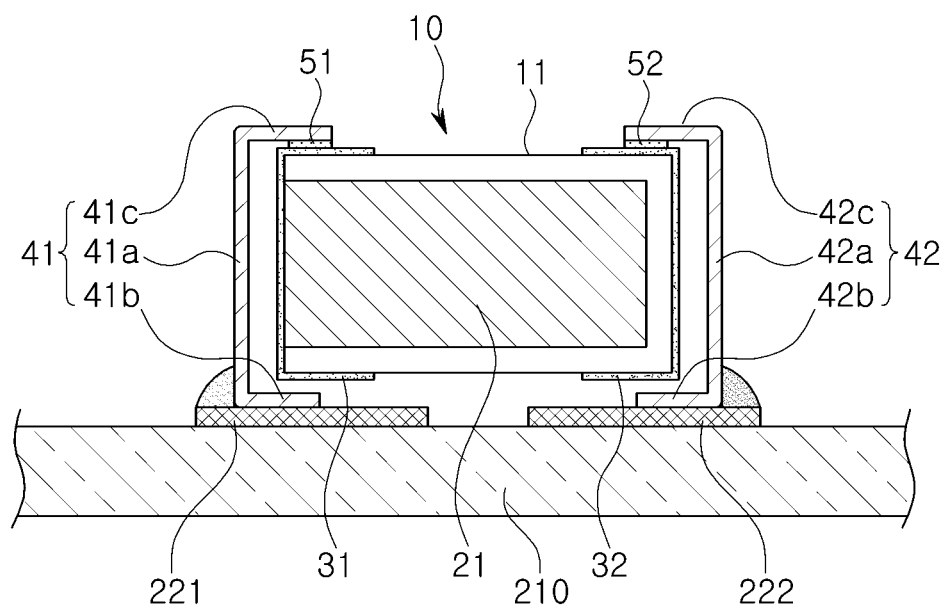
FIG. 13 is a lateral cross-sectional view schematically illustrating a board having a multilayer ceramic capacitor according to another exemplary embodiment in the present disclosure thereon.

FIG. 13 is a lateral cross-sectional view schematically illustrating a board having a multilayer ceramic capacitor according to another exemplary embodiment in the present disclosure.

The coupling structure and an action between a multilayer ceramic capacitor 10 and a board 210 in this embodiment are similar to that of the above-mentioned exemplary embodiment, so a detailed description thereof will be omitted.

As set forth above, according to the exemplary embodiments of the present disclosure, elastic force of the terminal electrodes disposed to be bonded to the upper surfaces of the band portions of the external electrodes may absorb the vibration transferred through the external electrodes of the ceramic body, thereby reducing acoustic noise.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
a ceramic body having internal electrodes disposed between dielectric layers and exposed to end surfaces of the ceramic body;
external electrodes includes connecting portions disposed on the end surfaces of the ceramic body and band portions extending to cover at least a portion of upper and lower surfaces of the ceramic body, wherein the end surfaces are disposed in a length direction and the upper and lower surfaces are disposed in a thickness direction;
terminal electrodes, each including:
an upper horizontal portion disposed at least partially above the band portion of the respective external electrode extending to cover at least a portion of the upper surface of the ceramic body,
a lower horizontal portion, and
a vertical portion including a first end connected to an end of the upper horizontal portion and a second end connected to an end of the lower horizontal portion; and
conductive adhesive layers disposed to connect the upper horizontal portions of the terminal electrodes with the portions of the respective external electrodes extending to cover at least a portion of the upper surface of the ceramic body,
wherein in a width direction, a width of the first end of the vertical portion is greater than a width of the end of the upper horizontal portion.

2. The multilayer ceramic capacitor of claim 1, wherein the vertical portions of the terminal electrodes are spaced apart from the respective external electrodes.

3. The multilayer ceramic capacitor of claim 1, wherein the lower horizontal portions of the terminal electrodes are spaced apart from the respective external electrodes.

4. The multilayer ceramic capacitor of claim 1, wherein:
the conductive adhesive layers are disposed between the upper horizontal portions of the terminal electrodes and the band portions of the respective external electrodes; and
the conductive adhesive layers have an area smaller than the area of the portions of the respective external electrodes extending to cover at least a portion of the upper surface of the ceramic body.

5. The multilayer ceramic capacitor of claim 1, wherein the upper horizontal portions of the terminal electrodes have one or more cut-out portions.

6. The multilayer ceramic capacitor of claim 5, wherein the conductive adhesive layers are disposed above both the upper horizontal portions of the terminal electrodes and the band portions of the respective external electrodes.

7. The multilayer ceramic capacitor of claim 5, wherein the upper horizontal portions of the terminal electrodes have cut-out portions in both sides in the width direction.

8. The multilayer ceramic capacitor of claim 5, wherein the upper horizontal portions of the terminal electrodes have a cut-out portion in the center in the width direction.

9. The multilayer ceramic capacitor of claim 1, wherein the terminal electrodes each further include a pair of guide portions connected to the respective vertical portions and extending to cover at least a portion of the side surfaces of the ceramic body.

10. The multilayer ceramic capacitor of claim 1, wherein the vertical portions of the terminal electrodes have cut-out portions in both sides in the width direction.

11. The multilayer ceramic capacitor of claim 1, wherein the vertical portions of the terminal electrodes have a cut-out portion in the center in the width direction.

12. A board having a multilayer ceramic capacitor thereon, comprising:
a board;
electrode pads disposed on an upper surface of the board and spaced apart from each other; and
a multilayer ceramic capacitor mounted on the board, wherein the multilayer ceramic capacitor comprises:
a ceramic body having internal electrodes disposed between dielectric layers and exposed to end surfaces of the ceramic body,
external electrodes includes connecting portions disposed on the end surfaces of the ceramic body and band portions extending to cover at least a portion of upper and lower surfaces of the ceramic body, wherein the end surfaces are disposed in a length direction and the upper and lower surfaces are disposed in a thickness direction,
terminal electrodes, each including:
an upper horizontal portion disposed at least partially above the band portion of the respective external electrode,
a lower horizontal portion, and
a vertical portion including a first end connected to an end of the upper horizontal portion and a second end connected to an end of the lower horizontal portion, and
conductive adhesive layers disposed to connect the upper horizontal portions of the terminal electrodes with the portions of the respective external electrodes extending to cover at least a portion of the upper surface of the ceramic body,
wherein in a width direction, a width of the first end of the vertical portion is greater than a width of the end of the upper horizontal portion,
wherein the lower horizontal portions of the terminal electrodes of the multilayer ceramic capacitor are positioned in contact with the respective electrode pads.

13. The board having a multilayer ceramic capacitor thereon of claim 12, wherein the vertical portions of the terminal electrodes are spaced apart from the respective external electrodes.

14. The board having a multilayer ceramic capacitor thereon of claim 12, wherein the lower horizontal portions of the terminal electrodes are spaced apart from the respective external electrodes.

15. The board having a multilayer ceramic capacitor thereon of claim 12, wherein:
the conductive adhesive layers are disposed between the upper horizontal portions of the terminal electrodes and the band portions of the respective external electrodes; and
the conductive adhesive layers have an area smaller than the area of the portions of the respective external electrodes extending to cover at least a portion of the upper surface of the ceramic body.

16. The board having a multilayer ceramic capacitor thereon of claim 12, wherein the upper horizontal portions of the terminal electrodes have one or more cut-out portions.

17. The board having a multilayer ceramic capacitor thereon of claim 16, wherein the conductive adhesive layers are disposed above both the upper horizontal portions of the terminal electrodes and the band portions of the respective external electrodes.

18. The board having a multilayer ceramic capacitor thereon of claim 16, wherein the upper horizontal portions of the terminal electrodes have cut-out portions in both sides in the width direction.

19. The board having a multilayer ceramic capacitor thereon of claim 16, wherein the upper horizontal portions of the terminal electrodes have a cut-out portion in the center in the width direction.

20. A method of manufacturing a multilayer ceramic capacitor, the method comprising:
forming a ceramic body by stacking first and second internal electrodes on ceramic sheets forming dielectric layers, such that the first and second internal electrodes are alternately disposed with respective dielectric layers interposed between and exposed to end surfaces of the ceramic body;
forming first and second external electrodes including connection portions to be disposed on the end surfaces of the ceramic body and band portions extending to cover at least a portion of upper and lower surfaces of the ceramic body, wherein the end surfaces are disposed in a length direction and the upper and lower surfaces are disposed in a thickness direction;
forming first and second terminal electrodes, each comprising an upper horizontal portion, a lower horizontal portion, and a vertical portion including a first end connected to an end of the upper horizontal portion and a second end connected to an end of the lower horizontal portion;
bonding the upper horizontal portions of the terminal electrodes with the band portions of the respective external electrodes by forming first and second conductive adhesive layers,
wherein in a width direction, a width of the first end of the vertical portion is greater than a width of the end of the upper horizontal portion.

21. The method of manufacturing a multilayer ceramic capacitor of claim 20, wherein the vertical and lower horizontal portions of the terminal electrodes are spaced apart from the respective external electrodes.

22. The method of manufacturing a multilayer ceramic capacitor of claim 20, the method further comprising:
forming first and second electrode pads disposed on an upper surface of a board and spaced apart from each other;
bonding the lower horizontal portions of the first and second terminal electrodes to the respective first and second electrode pads.

* * * * *